May 5, 1970 R. A. NICHOLS 3,510,682
DIGITAL CONTROLLED VARIABLE GAIN CIRCUIT
Filed Dec. 29, 1967 2 Sheets-Sheet 1
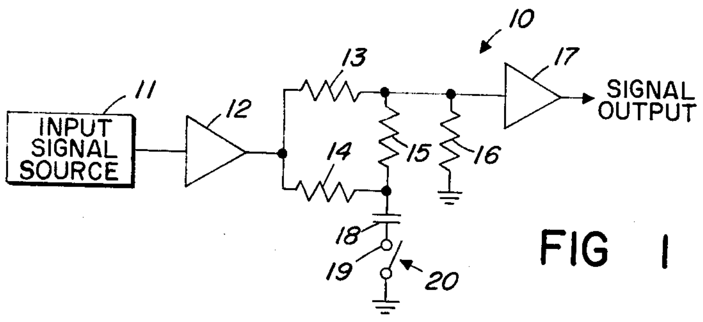
FIG 1
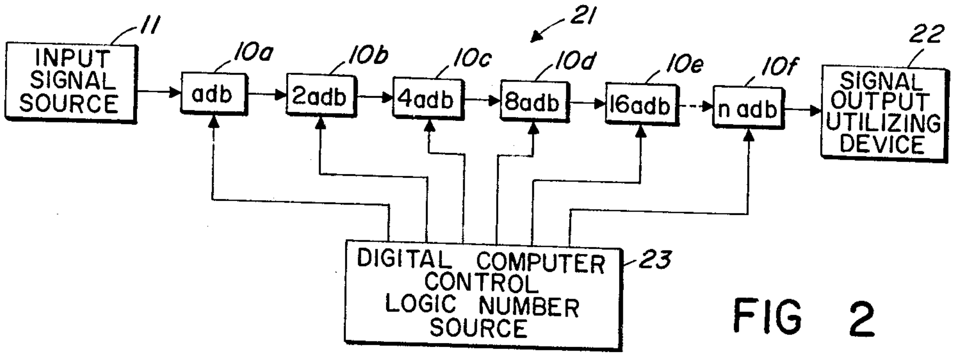
FIG 2
TYPICAL LOGIC REQUIRED FOR CIRCUIT OF FIG 2
| na | 16a | 8a | 4a | 2a | a | |
|---|---|---|---|---|---|---|
| 0 | 0 | 0 | 0 | 0 | 0 | GAIN MAX ($G_M$) |
| 0 | 0 | 0 | 0 | 0 | 1 | $G_M$-adb |
| 0 | 0 | 0 | 0 | 1 | 0 | $G_M$-2adb |
| 0 | 0 | 0 | 0 | 1 | 1 | $G_M$-3adb |
| 0 | 0 | 0 | 1 | 0 | 0 | $G_M$-4adb |
| 0 | 0 | 0 | 1 | 0 | 1 | $G_M$-5adb |
| 0 | 0 | 0 | 1 | 1 | 0 | $G_M$-6adb |
| 0 | 0 | 0 | 1 | 1 | 1 | $G_M$-7adb |
| 0 | 0 | 1 | 0 | 0 | 0 | $G_M$-8adb |
| 0 | 0 | 1 | 0 | 0 | 1 | $G_M$-9adb |
| 0 | 0 | 1 | 0 | 1 | 0 | $G_M$-10adb |
| 0 | 1 | 0 | 1 | 0 | 0 | $G_M$-20a |
| 1 | 0 | 0 | 0 | 0 | 0 | $G_M$-na |
FIG 3
INVENTOR.
RICHARD A. NICHOLS
BY
Warren C. Kintzinger
ATTORNEY INVENTOR.
RICHARD A. NICHOLS
BY
Warren ... [signature]
ATTORNEY United States Patent Office 3,510,682

Patented May 5, 1970

3,510,682

DIGITAL CONTROLLED VARIABLE GAIN CIRCUIT

Richard A. Nichols, Richardson, Tex., assignor to Collins Radio Company, Cedar Rapids, Iowa, a corporation of Iowa Filed Dec. 29, 1967, Ser. No. 694,583
Int. Cl. H03g *3/00*
U.S. Cl. 307—230 16 Claims

ABSTRACT OF THE DISCLOSURE

A variable gain circuit subject to logic number control from a digital computer with controlled gain changes accomplished in a microsecond or less, and with differential time delay through the circuit very low. It includes variable gain circuit sections each with a gain control circuit network interconnecting signal input and output amplifiers with attenuation through the network subject to step variation with opening and closing of an AC current path to ground from a point in a triangular resistive loop of the network as controlled by a switch for each section.

Figure 4:
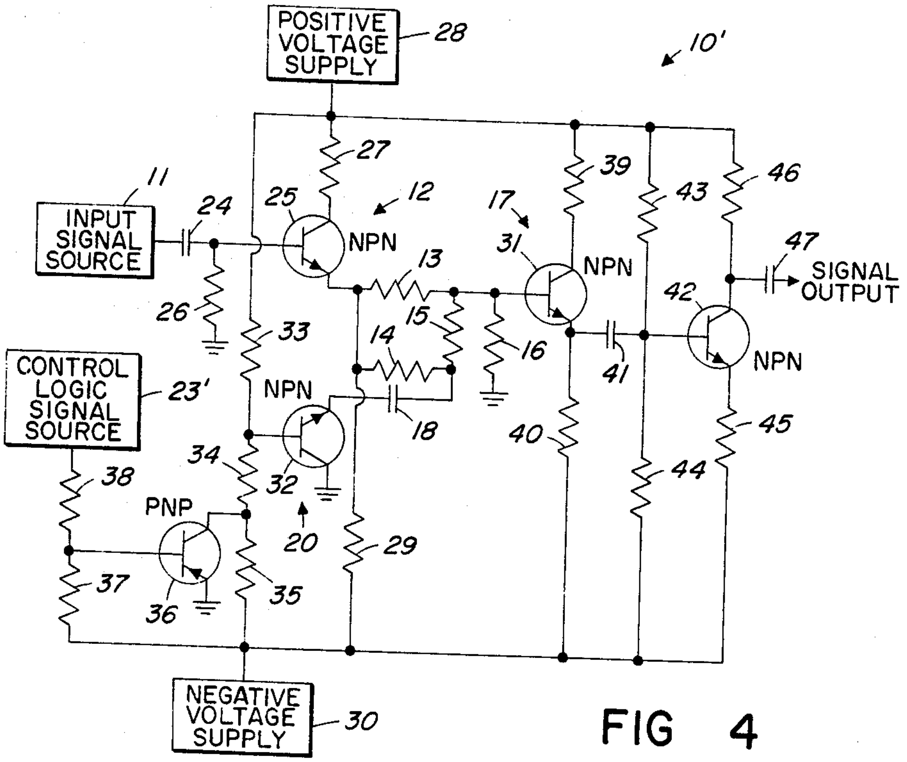

This invention relates in general to variable gain circuits, and in particular, to a multiple section variable gain circuit subject to fast, microsecond or less, gain change with control by logic numbers, as from a digital computer, and with very low differential phase and time delay through the circuit.

With many variable gain circuits subject to gain change through broad ranges gain change lag is excessive, and furthermore, differential time delay through many of the circuits is excessive. Amplifier linearity with some is good through only a narrow range of signal power levels, and some of the circuits are usable through only a relatively narrow frequency range. Many of the existing variable gain circuits are not readily adaptable to gain control by logic numbers from a digital computer and require digital to analog converters for the interface between the computer and the variable gain circuit.

It is, therefore, a principal object of this invention to provide a variable gain circuit subject to control by logic numbers from a digital computer without any requirement for digital to analog conversion in the interface.

Another object with such a variable gain circuit is to provide for gain change in microseconds or less, and for differential time delay through the circuit to be very low, as low as, for example, in the order of 3 nanoseconds for a 20 db gain change.

A further object is to provide good amplifier circuit linearity through a wide signal power level range, for example, from 3 microvolts to 30 millivolts, and further, to provide an expanded useful frequency range, typically, a range as broad as from audio through the HF range.

Features of the invention useful in accomplishing the above objects include, in a variable gain circuit, an amplifier circuit section having a signal input amplifier and a signal output amplifier with intervening gain control circuitry. This intervening circuitry includes in each section two resistors connected from the output of the input amplifier to opposite ends of a third resistor one end of which is connected as the signal path to the section output amplifier. The other end of the third resistor is connected through a switch to ground in order that an AC signal current path to ground be provided when the switch is closed. With this intervening circuitry the relative values of the three resistors determines the attenuation step and the capacitor prevents changing of bias on the output amplifier of the section with opening and closing of the switch by assuring that only AC signal current is passed through the switch. With several amplifier circuits cascaded and with the lowest section increment of gain change ½ db and then with the additional sections being 1, 2, 4, 8, 16, etc. db of gain differential per section, actually in binary steps, a binary logic number will, by activation and nonactivation of respective switches, select the desired total attenuation through from the signal input to output of the entire circuit. This is particularly useful in computer controlled receivers since any requirements for digital to analog converters in a control digital computer to variable gain control circuit interface are eliminated. The switch is generally in the form of an electronic switch, such as a bipolar or field effect transistor, and the capacitors connected between each switch and the intervening circuitry of the respective sections prevents direct current flow through the switch and otherwise resulting bias offset causing saturation resistance of switch devices to be nonlinear.

A specific embodiment representing what is presently regarded as the best mode of carrying out the invention is illustrated in the accompanying drawings.

Figure 5:
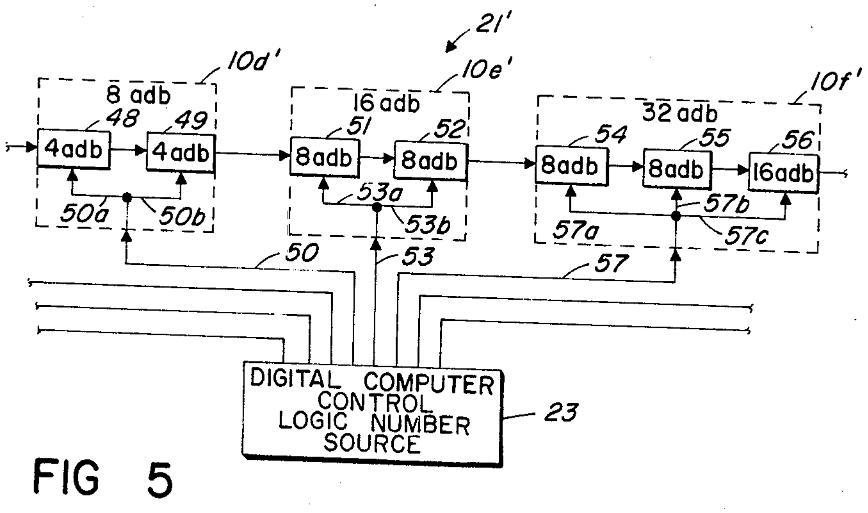

In the drawings:

FIG. 1 represents a combination block and schematic showing of a typical computer controlled gain section;

FIG. 2, a block schematic of a digitally controlled variable gain circuit including a multiplicity of cascaded serially connected gain sections such as shown in FIG. 1 as controlled by a digital computer control logic number source;

FIG. 3, a logic table of typical digital signal outputs from a digital computer control logic number source as required for giving various desired attenuations through a digital controlled variable gain circuit such as shown in FIG. 2;

FIG. 4, a more detailed schematic showing of a typical computer controlled gain section such as shown in FIG. 1 and as used in a cascaded multiple section digital controlled variable gain circuit shown in FIG. 2; and FIG. 5, a block schematic showing higher attenuation step function sections split into lower value db simultaneously actuated and deactivated cascaded step function subsections where low phase shift is required through the higher attenuation steps, and with the multiple subsections of each respective higher attenuation step section being cascaded for signal amplification or attenuation and their logic actuation inputs driven in parallel.

Referring to the drawings:

In the variable gain circuit section 10 of FIG. 1 a signal source 11 is connected as an input to amplifier 12. The output of amplifier 12 is connected to one end of resistors 13 and 14 the other ends of which are interconnected by resistor 15. The common junction of resistors 13 and 15 is connected through resistor 16 to ground, and also as an input to the section signal output amplifier 17. The common junction of resistors 14 and 15 is connected through capacitor 18 to terminal 19 of switch 20 and through the switch when closed to ground. Please note that switch 20 may be a standard switch, relay or chopper, a chopper type transistor or field effect transistor, and specifically in some installations it is an inverted connected chopper transistor. Generally the impedance out of amplifier 12 must be relatively low with the resistance value of resistor 14 greater than, for example, ten times the impedance out of amplifier 12, and that further, the input impedance of amplifier 17 should be greater than ten times the resistive value of resistor 16. Further attenuation in both switch 20 determined modes of operation with this variable gain section 10 is determined by the ratio of resistor 15 to resistor 13 and to resistor 14, and differential propagation delay through the stage is, typically, less than 3 nanoseconds with resistive values so matched with impedances of the amplifiers as to give at the output a 20 db gain step between the two modes of operation of the variable gain circuit section 10.

Referring now to FIG. 2, a digitally controlled and variable gain circuit 21 is shown to include a multiplicity of cascaded variable gain sections such as the section 10 of FIG. 1 with the first section 10*a* connected to receive the signal output from signal source 11. The remaining sections are connected to receive the input from each preceding cascaded section with 10*b* receiving an input from section 10*a* and successively sections 10*c*, 10*d*, 10*e* to section 10*f* the output of which is connected to signal output utilizing device 22 and with the possibility of additional sections being included between variable gain sections 10*e* and 10*f*. Each of the sections is connected to receive a controlling digital input from digital computer logic number source 23 with the switch 20 of each of the sections 10*a* through 10*f* being controlled by its digital signal output connection from the digital computer control source 23. Please note that the blocks representing variable gain sections 10*a* through 10*f* are labeled respectively *adb*, 2*adb*, 4*adb*, 8*adb*, 16*adb*, and *nadb*. With these sections cascaded in the manner shown in FIG. 2, and as would be possibly used in complete receiver system, if the lowest increment of gain change desired is ½ db then the successive serially additional sections would have 1, 2, 4, 8, 16, etc. db of gain differential between the two modes of operation per section. It is particularly significant that since the db attenuations are in binary steps that a binary logic number will then select the desired total attenuation, and is a particularly useful control technique. This is particularly useful for computer control receivers since digital to analog converters are not required in the interface between the digital computer control logic number source 23 and the overall variable gain circuit 21. In a Loran system navigation receiver, for example, the computer forms a part of the AGC loop with this technique and type of control being a most useful solution to various problems that have heretofore existed. The table of FIG. 3 illustrates how digital logic outputs of the digital computer control logic number source 23 would control a variable gain circuit 21 with *n* in the particular instance for a section 10*f* being the geometric number 32. Obviously, this could be geometrically expanded with more sections successively to 64 or on, for example, to 128 etc.

Referring now to the more detailed variable gain circuit section 10′ the input signal source 11 is connected through capacitor 24 to the base of NPN transistor 25 in amplifier 12. The junction of capacitor 24 and the base of NPN transistor 25 is connected through resistor 26 to ground. The collector of the transistor 25 is connected through resistor 27 to positive voltage supply 28. The emitter output of transistor 25 is connected through resistor 29 to the negative voltage supply 30 and also as the output from amplifier 12 to the adjacent end of resistors 13 and 14 just as in the variable gain section of FIG. 1 with, in this embodiment, the same components numbered the same as a matter of convenience. Here again the other end of resistors 13 and 14 are interconnected by resistor 15. The common junction of resistors 13 and 15 is connected through resistor 16 to ground, and also as an input to the base of NPN transistor 31 of output amplifier 17. The common junction of resistors 14 and 15 is connected through capacitor 18 to the emitter of NPN transistor 32 the collector of which is connected to ground. This NPN transistor 32, performing the function of switch 20 in this specific detailed embodiment, has a base connection to the common junction of resistors 33 and 34, through the resistor 33 to the positive voltage supply 28, also through the resistor 34 and on through resistor 35 to the negative voltage supply 30. The connection for controlled switching action of the NPN transistor 32, as switch 20, is from the common junction of resistors 34 and 35 to the collector of PNP transistor 36 the emitter of which is connected to ground, and the base of which is connected both through resistor 37 to the negative voltage supply 30 and through resistor 38 to control logic signal source 23′. Referring back again to amplifier 17 the collector of NPN transistor 31 is connected through resistor 39 to the positive voltage supply 28, and the emitter output of the transistor is connected both through resistor 40 to the negative volage supply 30 and in the signal path through capacitor 41 to the base of PNP transistor 42. The common junction of capacitor 41 and the base of PNP transistor 42 is connected both through resistor 43 to the positive voltage supply 28 and through resistor 44 to the negative voltage supply 30. The emitter of transistor 42 is connected through resistor 45 to the negative voltage supply 30 while its collector output is connected through resistor 46 to the positive voltage supply 28 and also in the signal output path through capacitor 47 to any succeeding signal output utilizing circuitry.

In a particular variable gain circuit section built in accord with section 10′ of FIG. 4 and with specific component values and voltages utilized the relative values of the resistors 13, 14 and 15 were such as to provide a 12 db attenuation function step. In this particular variable gain circuit section capacitor 18 prevents changing of bias on NPN transistor 31 with switching of NPN transistor 32 on and off, as the switch 20, and assures that only AC signal current be conducted through the emitter circuit of transistor 32. It is necessary, particularly when bipolar or field effect transistors are used in switch 20, to prevent direct current from flowing through the switch transistor 32, since the resulting bias offset with such DC current flow would generally cause the saturation resistance of the device to be nonlinear.

An operational variable gain circuit section 10′, such as shown in FIG. 4, and providing a 12 db gain function attenuation step includes component values and voltages as follows:

Resistor 13—1.13K ohms
14—511 ohms
15—316 ohms
16—1.96K ohms
Capacitor 18—10 μfd.
Control logic signal source 23′ signal voltage—+3.3 volts for maximum gain, 0 volt for maximum gain—12 db
Capacitors 24, 41, and 47—1.0 μfd.
NPN transistors 25, 31 and 42—2N918
Resistors 26 and 37—10K ohms
27 and 39—100 ohms
Positive voltage supply 28—+5 volts
Resistors 29 and 40—3.9K ohms
Negative voltage supply 30——15 volts
NPN transistor 32—2N2432
Resistor 33—1K ohm
34—820 ohms
35—1.2K ohms
PNP transistor 36—2N2907
Resistor 38—1.5K ohms
43—12K ohms
44—2.33K ohms
45—406 ohms
46—1.8K ohms With many variable gain sections the db step from maximum gain to the lower attenuated mode of operation would span from a positive gain through unity gain to a lower gain factor. This is subject to adjustment with various component values and supply voltages being used and, particularly with larger attenuation db steps, selection of an operational gain range optimizing signal linearity through the system. With these various multiple section variable gain circuits gain can be set by computer derived logic number and with the gain change accomplished in a microsecond or less. Differential time delay through these circuits is quite low, typically 3 nanoseconds for a 20 db gain change. Further, signal amplification linearity through from input to output of the multiple section variable gain circuits is generally quite good through an extended range of signal power levels, for example, with some of the circuits, a signal power level range from 3 microvolts to 30 millivolts, and this with these circuits generally usable through a broad frequency range, from audio through HF for example.

FIG. 5 illustrates an approach for insuring that low phase shift be retained through high attenuation steps in a multisection variable gain circuit 21'. This entails the cascading of two or more typical subsections for the desired signal amplification attenuation factors with their logic activation inputs driven in parallel to provide the specific higher attenuation steps desired. This would entail, as illustrated, in an 8 db higher attenuation step section **10*d'* the use of two subsections 48 and 49 each a 4 db section serially cascaded and with a lead 50 from the digital control logic number source 23 having two branch extensions 50*a* and 50*b* connected to the subsections 48 and 49 respectively. The 16*adb* high attenuation step function section 10*e'* utilizes 8*adb* subsections 51 and 52 in serially connected cascaded relation with lead 53 from the computer 23 having branch connections 53*a* and 53*b* connected to the 8*adb* subsections 51 and 52 respectively. The even higher 32*adb* attenuation step function section 10*f'* is shown to have three subsections, two 8*adb* subsections 54 and 55 and then in serially connected cascaded relation a final 16*adb* subsection 56. Lead 57 from computer 23 has three branches 57*a*, 57*b*, and 57*c* connected to the section 10*f'* subsections 54, 55 and 56** respectively. Obviously, even higher major attenuation steps may be provided with different db sections cascaded in pairs or more subsections as may be appropriate in insuring the retention of relatively low phase shift through the higher attenuation steps in such variable gain circuits.

Whereas this invention is here illustrated and described with respect to specific embodiments thereof, it should be realized that various changes may be made without departing from the essential contributions to the art made by the teachings hereof.

I claim:

1. In a variable gain circuit: a variable gain circuit section having, input signal conveying means adapted for connection to a signal source, output signal conveying means adapted for connection to signal output utilizing means, and intervening gain control circuitry connected between said input and said output signal conveying means; with said intervening gain control circuitry including, first resistive means connected between a first junction and a second junction, second resistive means connected between said first junction and a third junction, and third resistive means connected between said second and third junctions; with said first junction connected to said input signal conveying means, and said second junction connected to said output signal conveying means; and a capacitor and switch means serially connected between said third junction and a voltage potential reference source, and with said switch means being subject to being controlled for opening and closing the circuit between said third junction and the voltage potential reference source to AC signal current flow.

2. The variable gain circuit of claim 1, wherein at least one of said input and output signal conveying means is an amplifier.

3. The variable gain circuit of claim 1, wherein both of said input and output signal conveying means are amplifiers.

4. The variable gain circuit of claim 1, wherein said switch means includes an electronic signal control actuated solid state switching device; and electronic control signal means connected to said solid state switching device for signal controlled switching of said solid state device between circuit switched open and closed states of operation.

5. The variable gain circuit of claim 4, wherein said switch means is a transistor so circuit connected as to conduct AC signal current flow through the emitter circuit when actuated to conduction.

6. The variable gain circuit of claim 1, including a plurality of said variable gain circuit sections connected in serially cascaded relation; with amplifying means included in each interconnection between said variable gain sections as said output signal conveying means of one of said sections and as said input signal conveying means of the next said variable gain section.

7. The variable gain circuit of claim 6, wherein said switch means of each said variable gain circuit section includes an electronic signal control actuated solid state switching device; and electronic control signal means connected to said solid state switching device for signal controlled switching of said solid state device between circuit switched open and closed states of operation.

8. The variable gain circuit of claim 7, wherein said switch means is a transistor so circuit connected as to conduct AC signal current flow when actuated to conduction; and with said voltage potential reference source being ground.

9. The variable gain circuit of claim 7, wherein said electronic control signal means includes a multiple output computer with individual outputs connected to individual variable gain sections.

10. The variable gain circuit of claim 9, wherein individual variable gain circuit sections are designed and adjusted for individual specific db steps between maximum signal gain through the section and minimum signal gain through the section as determined by the operationally actuated state of the respective section switch means being open or closed to AC signal current flow.

11. The variable gain circuit of claim 10, wherein said individual variable gain circuit sections are serially aligned in successive binary db steps; said multiple output computer is a digital computer control logic number source providing binary logic number outputs via multiple signal output connections individually to individual switch means of respective variable gain sections in order that binary logic number output of said computer will by activation and nonactivation of respective switches select the desired total attenuation through from the signal input to the output of the entire variable gain circuit.

12. The variable gain circuit of claim 10, including at least one variable gain portion having a plurality of said variable gain sections serially cascade connected through that portion; with the switch means of the sections of the respective portion connected in parallel to a single individual output of said multiple output computer to be simultaneously actuated and deactivated as signal controlled by the computer to give a total attenuation step through the respective variable gain portion equal to the sum total of the attenuation steps through the variable gain sections of that variable gain portion.

13. The variable gain circuit of claim 6, wherein with respect to an least one of said variable gain circuit sections first amplifying means is used as said input signal conveying means with impedance out relatively low, and with said second resistive means of the respective section having a resistance value greater than approximately ten times the impedance out of said input signal conveying means.

14. The variable gain circuit of claim 13, wherein said first amplifying means includes a transistor having an emitter output connection to said second resistive means.

15. The variable gain circuit of claim 13, wherein a fourth resistive means is connected between said second junction and said voltage potential reference source, and second amplifying means is used as said output signal conveying means having input impedance greater than approximately ten times the resistive value of said fourth resistive means.

16. The variable gain circuit of claim 15, wherein said second amplifying means includes a transistor having a base connection to said second junction and said fourth resistive means.

References Cited

UNITED STATES PATENTS

| | | | |
|---|---|---|---|
| 3,158,818 | 11/1964 | Plumpe | 330—29 |
| 3,378,786 | 4/1968 | Andrea | 330—137 |

JOHN S. HEYMAN, Primary Examiner

S. D. MILLER, Assistant Examiner

U.S. Cl. X.R.

307—235, 237, 242, 253; 328—168; 330—29, 130